United States Patent
Kwon et al.

(10) Patent No.: US 11,309,590 B2
(45) Date of Patent: Apr. 19, 2022

(54) BATTERY PACK WITH IMPROVED ASSEMBLY STRUCTURE

(71) Applicant: LG Chem, Ltd., Seoul (KR)

(72) Inventors: Hee-Yong Kwon, Daejeon (KR); Jun-Yeob Seong, Daejeon (KR)

(73) Assignee: LG Energy Solution, Ltd.

( * ) Notice: Subject to any disclaimer, the term of this patent is extended or adjusted under 35 U.S.C. 154(b) by 209 days.

(21) Appl. No.: 16/606,060

(22) PCT Filed: Nov. 6, 2018

(86) PCT No.: PCT/KR2018/013399
§ 371 (c)(1),
(2) Date: Oct. 17, 2019

(87) PCT Pub. No.: WO2019/088803
PCT Pub. Date: May 9, 2019

(65) Prior Publication Data
US 2020/0194843 A1    Jun. 18, 2020

(30) Foreign Application Priority Data
Nov. 6, 2017    (KR) .......................... 10-2017-0146652

(51) Int. Cl.
*H01M 10/42*    (2006.01)
*H01M 10/48*    (2006.01)
(Continued)

(52) U.S. Cl.
CPC ......... *H01M 10/425* (2013.01); *H01M 10/48* (2013.01); *H01M 10/482* (2013.01);
(Continued)

(58) Field of Classification Search
None
See application file for complete search history.

(56) References Cited

U.S. PATENT DOCUMENTS

| 2011/0236732 A1* | 9/2011 | Meehan | .............. H01M 50/148 |
|---|---|---|---|
|  |  |  | 429/53 |
| 2015/0069829 A1 | 3/2015 | Dulle et al. |  |
| 2015/0295283 A1 | 10/2015 | Eom et al. |  |

(Continued)

FOREIGN PATENT DOCUMENTS

| CN | 105190937 A | 12/2015 |
| CN | 106030849 A | 10/2016 |

(Continued)

OTHER PUBLICATIONS

Extended European Search Report including Written Opinion for EP18873469.3 dated Jul. 14, 2020; 7 pages.

(Continued)

*Primary Examiner* — Jonathan Crepeau
(74) *Attorney, Agent, or Firm* — Lerner, David, Littenberg, Krumholz & Mentlik, LLP

(57) ABSTRACT

The battery pack includes a cell module assembly that includes battery cells arranged to be stacked, a cell case accommodating the battery cells, and first positive and negative electrode bus bars electrically connected to the battery cells. The battery pack further includes a battery management system (BMS) assembly that includes a BMS circuit board, a current sensor unit vertically disposed at an edge of the BMS circuit board, and a BMS housing that supports the BMS circuit board. Further, the battery pack includes a pack cover that includes positive and negative electrode terminals and second positive and negative electrode bus bars electrically connected to the positive and negative electrode terminals. The pack cover is configured to cover an upper portion of the BMS housing, and the first negative electrode bus bar and the second negative electrode bus bar respectively have one end vertically connected to the current sensor unit.

13 Claims, 14 Drawing Sheets

(51) Int. Cl.
*H01M 50/572* (2021.01)
*H01M 50/528* (2021.01)
*H01M 50/20* (2021.01)
*H01M 50/502* (2021.01)

(52) U.S. Cl.
CPC ......... *H01M 50/20* (2021.01); *H01M 50/502* (2021.01); *H01M 50/572* (2021.01); *H01M 50/528* (2021.01); *H01M 2010/4271* (2013.01); *H01M 2220/20* (2013.01)

(56) References Cited

U.S. PATENT DOCUMENTS

| | | |
|---|---|---|
| 2016/0072118 A1 | 3/2016 | Park et al. |
| 2016/0351868 A1 | 12/2016 | Eom et al. |
| 2017/0194674 A1 | 7/2017 | Lee et al. |
| 2017/0352924 A1 | 12/2017 | Yasunori |
| 2018/0076487 A1 | 3/2018 | Lee et al. |
| 2018/0212215 A1 | 7/2018 | Park et al. |

FOREIGN PATENT DOCUMENTS

| | | |
|---|---|---|
| JP | 200422341 A | 1/2004 |
| JP | 2006-214855 A | 8/2006 |
| JP | 2014-137223 A | 7/2014 |
| JP | 2014137223 A | 7/2014 |
| JP | 20155483 A | 1/2015 |
| JP | 2016-024846 A | 2/2016 |
| JP | 201681762 A | 5/2016 |
| JP | 2016134196 A | 7/2016 |
| KR | 10-2015-0044800 A | 4/2015 |
| KR | 20-2015-0003570 U | 10/2015 |
| KR | 10-2016-0077758 A | 7/2016 |
| KR | 10-1692632 B1 | 1/2017 |
| KR | 10-2017-0011349 A | 2/2017 |
| KR | 10-2017-0050508 A | 5/2017 |
| KR | 10-2017-0066896 A | 6/2017 |
| KR | 10-1743701 B1 | 6/2017 |
| KR | 10-2017-0095136 A | 8/2017 |
| WO | 2017039180 A1 | 3/2017 |

OTHER PUBLICATIONS

Japanese Search Report for Application No. 2019-556210, dated Sep. 17, 2020, pp. 1-11.
Search Report for Chinese Application No. 201880033323.7 dated Nov. 3, 2021. 3 pgs.

* cited by examiner

PRIOR ART

BATTERY PACK WITH IMPROVED ASSEMBLY STRUCTURE

CROSS-REFERENCES TO RELATED APPLICATIONS

This application is a U.S. national phase application, pursuant to 35 U.S.C. § 371, of PCT/KR2018/013399, filed Nov. 6, 2018, designating the United States, which claims priority to Korean Application No. 10-2017-0146652, filed Nov. 6, 2017. The entire contents of the aforementioned patent applications are incorporated herein by this reference.

TECHNICAL FIELD

The present disclosure relates to a battery pack, and more particularly, to a battery pack with an improved assembling structure in which main components are modularized to simplify or minimize a connection path of a current sensor and bus bars.

BACKGROUND ART

Secondary batteries commercially available at present include nickel cadmium batteries, nickel hydrogen batteries, nickel zinc batteries, lithium secondary batteries, and the like. Among them, the lithium secondary battery is being spotlighted since it provides flexible charging and discharging due to substantially minimal memory effect and has significantly low discharge rate and high energy density, compared to nickel-based secondary batteries.

A power supply system of a battery pack using the secondary battery generally has a current sensor for measuring the current. The current sensor measures the current that flows in the charging and discharging path of the battery pack to monitor the condition of the battery pack and detects an overcurrent that flows in the battery pack. In addition, the current measured by the current sensor may be utilized as information for calculating a state of charge (SOC) or as a basis for determining whether the charging and discharging process is normally performed or not.

In the case of a lithium secondary battery pack, which is currently spotlighted as an energy storage device for an electric vehicle, a shunt resistor is generally used as the current sensor when measuring the current of the battery pack, since the charging and discharging current is as large as about 100 A to 300 A.

In the conventional battery pack, as shown in FIG. 1, after a lead pin is soldered onto a BMS circuit board, the shunt resistor 1 is mounted in parallel with the BMS circuit board with a predetermined gap. In addition, bus bars 3a and 3b that form a charging and discharging path of the battery pack are bolted to terminals of the shunt resistor.

However, in the conventional art, the bus bars require a complicated bending shape in order to be fastened to the shunt resistor. In other words, in order to secure the space for assembling the BMS circuit board and other major components, the bus bars are elongated and their shape is complicated. Moreover, the area available for the BMS circuit board is reduced due to the area of the shunt resistor, the area interfered by the bus bars, and the like, and it is not easy to insulate the BMS circuit board against the shunt resistor and the bus bars. The problem of the connection between the current sensor and the bus bars affects the layout and fastening structure of other main components, thereby serving as one of factors that complicates the designing of the battery pack.

DISCLOSURE

Technical Problem

The present disclosure is designed to solve the problems of the related art, and therefore the present disclosure is directed to providing a battery pack with an improved assembling structure in which main components are modularized to simplify or minimize a connection path of a current sensor and bus bars.

However, the objects of the present disclosure are not limited to the above, and objects not mentioned herein may be clearly understood from the present specification and the accompanying drawings by those skilled in the art.

Technical Solution

In one aspect of the present disclosure, a battery pack may include: a cell module assembly that includes battery cells arranged to be stacked, a cell case accommodating the battery cells, and a first positive electrode bus bar and a first negative electrode bus bar that are electrically connected to the battery cells and having ends that extend to the outside of the cell case; and a battery management system (BMS) assembly that includes a BMS circuit board and a BMS housing that supports the BMS circuit board. A lower portion of the BMS housing is coupled to the cell case. The battery pack further includes a pack cover having a positive electrode terminal and a negative electrode terminal, and a second positive electrode bus bar and a second negative electrode bus bar that are electrically connected to the positive electrode terminal and the negative electrode terminal. In particular, the pack cover is configured to cover an upper portion of the BMS housing.

The BMS assembly may further include a current sensor unit vertically disposed at an edge of the BMS circuit board, and one end the first negative electrode bus bar and one end the second negative electrode bus bar may be respectively connected to the current sensor unit.

The current sensor unit may include a shunt formed as a plate-shaped metal resistor connected to the first negative electrode bus bar and the second negative electrode bus bar and having a bolt aperture formed at each end thereof, the shunt being vertically disposed with respect to the BMS circuit board; and a shunt support member configured to clamp the shunt to be vertically disposed, the shunt support member being fixedly coupled onto the BMS circuit board.

The BMS circuit board may have a shunt installation portion formed at one side of the edge thereof and screw-fastened to the shunt support member, and both side portions of the BMS circuit board with respect to the shunt installation portion may be cut out to form an empty space at least by a length of the shunt.

The shunt support member may include a clamping portion formed as a slot into which a center portion of the shunt is inserted; and a mounting portion attached to the shunt installation portion to surround an end of the shunt installation portion.

The mounting portion may have an assembling guide pin that vertically extends at a lower surface thereof, and the shunt installation portion may have a guide pin aperture into which the assembling guide pin is inserted.

The BMS housing may have a horizontal surface on which the BMS circuit board is disposed, and a nut support member may be provided at the horizontal surface to vertically support a nut, allowing the nut to be disposed at a rear of the bolt aperture of the shunt.

A horizontal surface of the BMS housing may have a bus bar access portion formed by opening a lower portion thereof below the shunt to allow the first negative electrode bus bar to be directly coupled to the shunt at a location directly below the shunt.

The pack cover and the BMS housing may have a first hooking aperture and a first hooking protrusion, respectively, provided to be snap-fitted with each other along outer peripheries thereof, and the BMS housing and the cell case may have a second hooking aperture and a second hooking protrusion, respectively, provided to be snap-fitted with each other along outer peripheries thereof.

The BMS housing may further include at least one leg formed at a lower surface of the BMS housing to extend downward in a vertical direction by a predetermined length, and the cell case may have a leg insert groove into which the at least one leg is inserted and coupled in one-to-one relationship.

An insertion depth of the leg into the leg insert groove may be restricted to allow the BMS housing to be supported and spaced apart from the battery cells with a predetermined interval.

Outer peripheries of the BMS housing and the pack cover that correspond to each other in a vertical direction may be partially recessed to form a fastening window therebetween when the BMS housing and the pack cover are coupled, and the fastening window may provide a space in which the first negative electrode bus bar and the second negative electrode bus bar are bolted to both ends of the shunt.

The pack cover may have a ridge portion formed to be convex toward an outer direction and may include a space therein to allow a current breaking unit configured to obstruct an electric current of the battery cells to be mounted within the ridge portion.

In another aspect of the present disclosure, an electric vehicle may include the battery pack described above.

Advantageous Effects

According to an embodiment of the present disclosure, a battery pack is provided, which may simplify or minimize a connection path of a current sensor and bus bars.

In addition, since the current sensor is vertically disposed on the BMS circuit board, it is possible to increase the area in which the BMS circuit board is utilized and also to solve the electrical interference with the bus bars.

According to another embodiment of the present disclosure, since main components are modularized to be easily fastened to each other, it is possible to provide a battery pack with an improved assembling structure.

The effects of the present disclosure are not limited to the above, and effects not mentioned herein may be clearly understood from the present specification and the accompanying drawings by those skilled in the art.

BEST MODE

Figure 1:
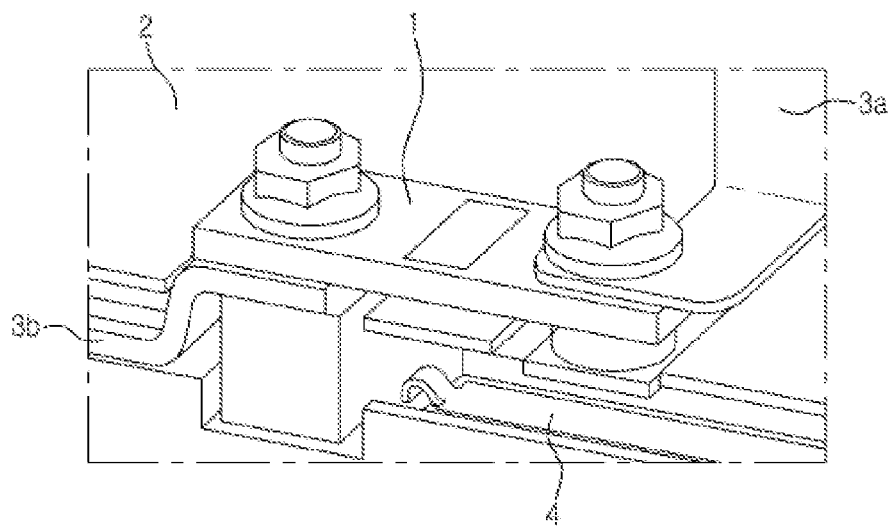
FIG. 1 is a diagram showing a connection structure of a current sensor horizontally mounted to a BMS circuit board of a conventional battery pack and bus bars around the current sensor.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The embodiments disclosed herein are provided for more perfect explanation of the present disclosure, and thus the shape, size and the like of components may be exaggerated, omitted or simplified in the drawings for better understanding. Thus, the size and ratio of components in the drawings do not wholly reflect the actual size and ratio.

Figure 2:
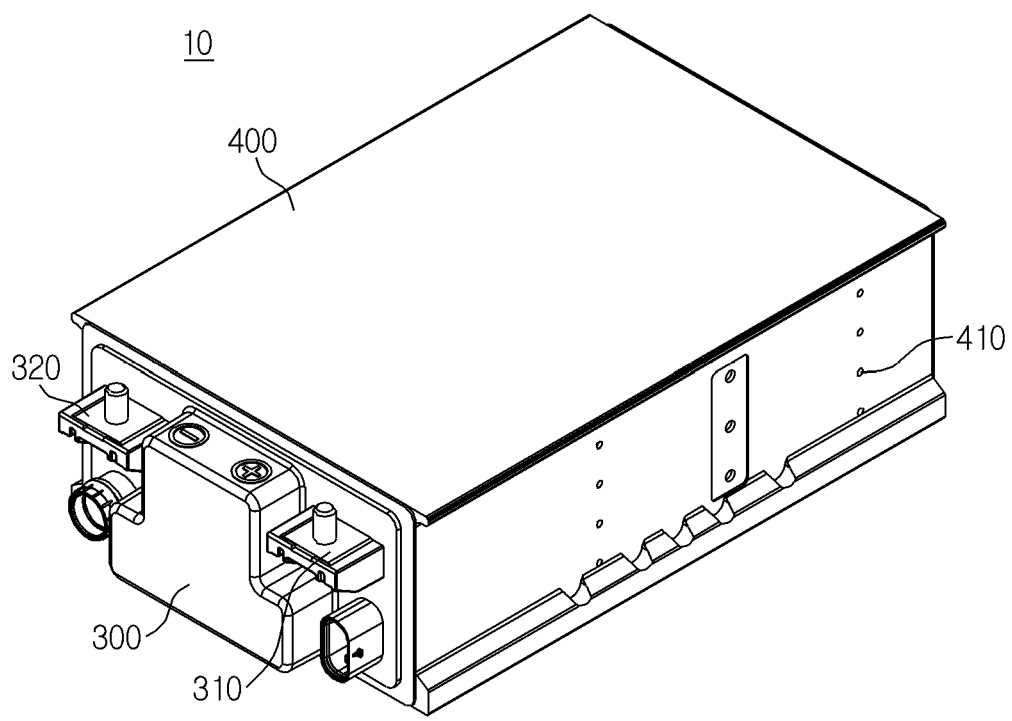
FIGS. 2 and 3 are perspective views schematically showing a battery pack according to an embodiment of the present disclosure.
Figure 3:
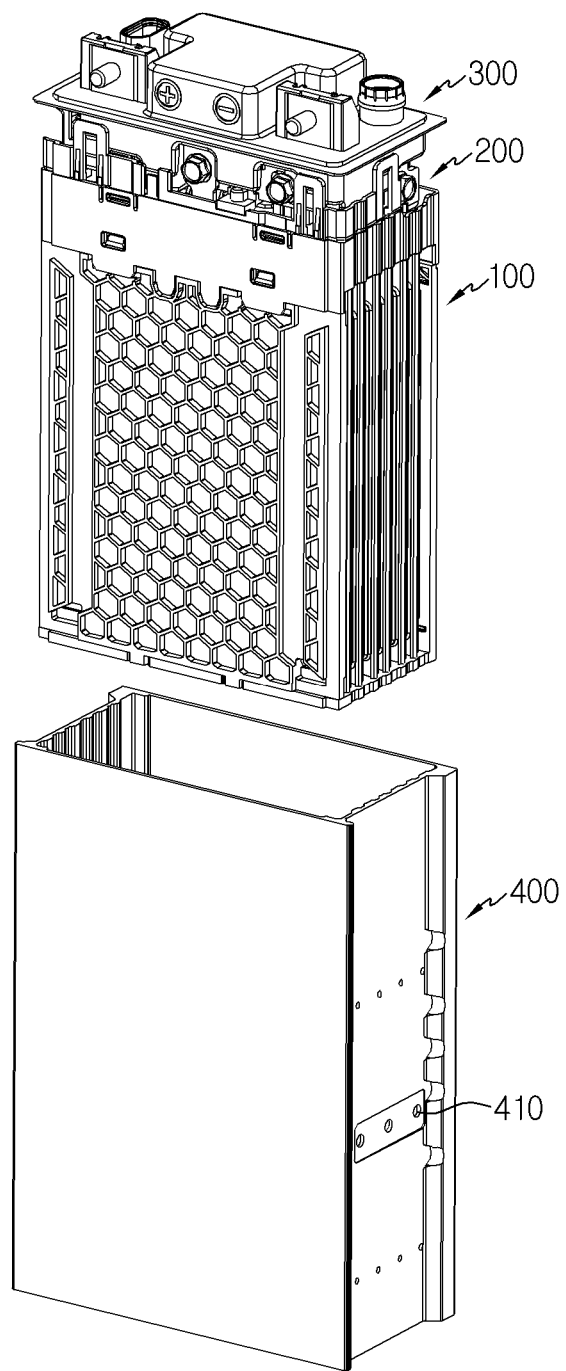
Figure 4:
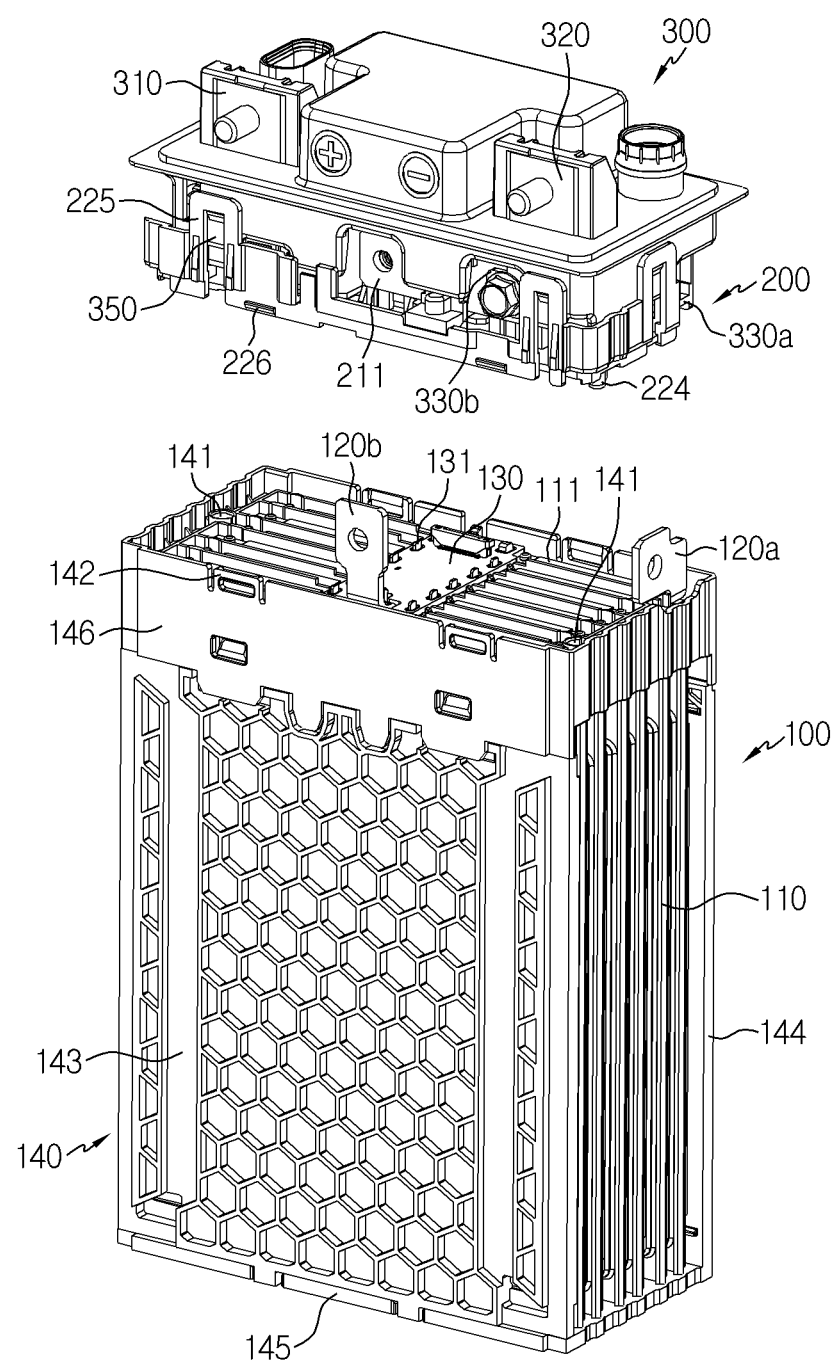
FIG. 4 is a perspective view in which main components of the battery pack with a pack case removed according to an embodiment of the present disclosure.

FIGS. 2 and 3 are perspective views schematically showing a battery pack according to an embodiment of the present disclosure, and FIG. 4 is a perspective view in which main components of the battery pack with a pack case removed according to an embodiment of the present disclosure.

Referring to FIGS. 2 and 3, a battery pack 10 according to an embodiment of the present disclosure may include a cell module assembly 100, a battery management system (BMS) assembly 200, a pack cover 300, and a pack case 400.

As shown in FIG. 4, in the battery pack 10, the cell module assembly 100 may be provided as a module, and an assembly including the BMS assembly 200 and the pack cover 300 may be provided as another module, so that two modules are assembled or disassembled in a snap-fitting manner. In addition, the cell module assembly 100, the BMS assembly 200 and the pack cover 300 assembled as above may be accommodated and packaged in the pack case 400.

In other words, the battery pack 10 according to the present disclosure may be easily assembled or disassembled and also be more easily maintained later since its main components are modularized.

In particular, as explained in detail later, in the battery pack 10 according to the present disclosure, the connection structure of a current sensor unit 211 and the bus bars is simplified and minimized to allow the assembly including the BMS assembly 200 and the pack cover 300 to be directly coupled to the cell module assembly 100 in an efficient way, thereby improving the space utilization and the assembling work efficiency compared to the conventional art.

Figure 5:
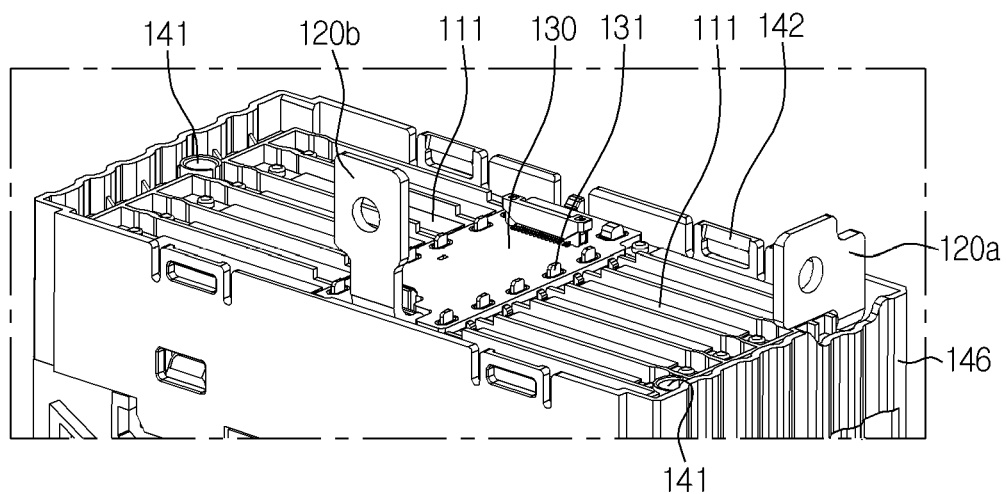
FIG. 5 is a partially enlarged view showing the cell module assembly of FIG. 4.

The cell module assembly 100 employed at the battery pack 10 of the present disclosure will be described with reference to FIGS. 4 and 5 together. The cell module assembly 100 may include battery cells 110, a voltage sensing unit for sensing the voltage of the battery cells 110, a first positive electrode bus bar 120a, a first negative electrode bus bar 120b, and a cell case 140 for supporting and holding the battery cells 110.

The battery cells 110 may be pouch-type battery cells 110 that are stacked such that their larger surfaces are arranged in one direction and that have electrode leads 111 that extend in an end direction thereof. In particular, the pouch-type battery cells 110 refers to secondary batteries, each including a pouch case, and an electrode assembly and an electrolyte accommodated within the pouch case.

For example, the pouch-type case may have two pouches, at least one of which may have a concave inner space. In addition, the electrode assembly may be accommodated within the inner space of the pouch. Peripheral regions of the two pouches are fused together to allow the inner space that accommodates the electrode assembly to be sealed. The electrode lead 111 may be attached to the electrode assembly, and the electrode lead 111 may be interposed between the fused portions of the pouch case and exposed to the outside of the pouch case to function as an electrode terminal of the battery cell 110.

The voltage sensing unit may be disposed at a region where the electrode leads 111 protrude from the battery cells 110. The voltage sensing unit may be connected to a BMS circuit board 210 to provide voltage data or the like of the battery cell 110 to the BMS. The BMS may control the operation of the battery cells 110 such as charging or discharging based on the data.

The voltage sensing unit may include a voltage sensing board 130 and a plurality of lead connecting bus bars 131. The electrode leads 111 of the battery cells 110 may be connected in series and/or in parallel to the plurality of lead connecting bus bars 131 by, for example, ultrasonic welding, and the lead connecting bus bars 131 may be connected to the voltage sensing board 130. In particular, the lead connecting bus bars 131 are a component serving as a current path and may be made of an electrically conductive metal such as copper or aluminum.

The first positive electrode bus bar 120a and the first negative electrode bus bar 120b may be formed by extending two of the lead connecting bus bars 131 to be longer than other lead connecting bus bars, and they may be connected to a first battery cell 110 and a last battery cell 110 in the stacking order of the battery cells 110. In other words, the first negative electrode bus bar 120b may be connected to the negative electrode lead 111 of the first battery cell 110, and the first positive electrode bus bar 120a may be connected to the positive electrode lead 111 of the last battery cell 110. As will be explained later, the first positive electrode bus bar 120a and the first negative electrode bus bar 120b may be formed so that their ends extend vertically to protrude to the outside of the cell case 140.

The cell case 140 may include a first plate 143 and a second plate 144 for covering a wider surface of an outermost battery cell 110 among the stacked battery cells 110, a third plate 145 for connecting side edges of the first plate 143 and the second plate 144 and covering a side that is opposite to the voltage sensing unit with respect to the battery cells 110, and a cap frame 146 having a rectangular ring shape and snap-fitted to the first plate 143 and the second plate 144 to surround the periphery of a region where the electrode leads and the voltage sensing unit are disposed.

Although the pouch-type battery cells 110 may be easily stacked due to their characteristics, the pouch-type battery cells 110 have decreased mechanical rigidity since they are packaged with an aluminum sheet. The cell case 140 may be regarded as a structure for allowing the pouch-type battery cells 110 to be stacked without moving.

The cell case 140 according to the present disclosure is configured such that cell edge regions disposed at side surfaces of the stacked battery cells 110 are exposed to the outside of the cell case 140. A resin may be filled between the cell edge regions later. For reference, the resin may be injected into the pack case 400 through resin injection apertures 410 formed in the side surface of the pack case 400, and the resin may fixate the battery cells 110 and serve as a heat conduction medium for the battery cells 110.

The cap frame 146 of the cell case 140 may have second hooking apertures 142 formed at an outer periphery thereof. The second hooking apertures 142 are fastening means that correspond to second hooking protrusions 226 provided at an outer periphery of the BMS housing 220 in one-to-one relationship.

The cell module assembly 100 may be fastened to the assembly including the BMS assembly 200 and the pack cover 300 in a snap-fitting manner. In particular, the first negative electrode bus bar 120b may be vertically accessed to the current sensor unit 211 of the assembly, and the first positive electrode bus bar 120a may be vertically accessed to the second positive electrode bus bar 330a. In addition, the first negative electrode bus bar 120b and the current sensor unit 211 may be coupled to the first positive electrode bus bar 120a and the second positive electrode bus bar 330a by fastening bolts B at their contact surfaces.

Hereinafter, the BMS assembly 200 and pack cover 300 that enable the above connection will be described in detail.

Figure 6:
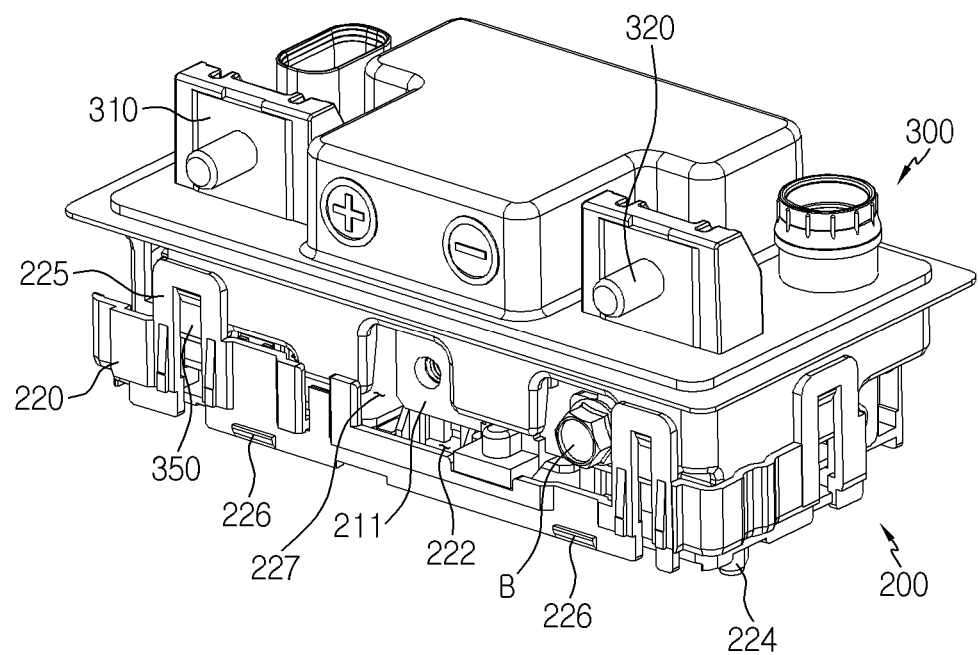
FIG. 6 is a perspective view showing an assembled state of the BMS assembly and the pack cover of FIG. 4.
Figure 7:
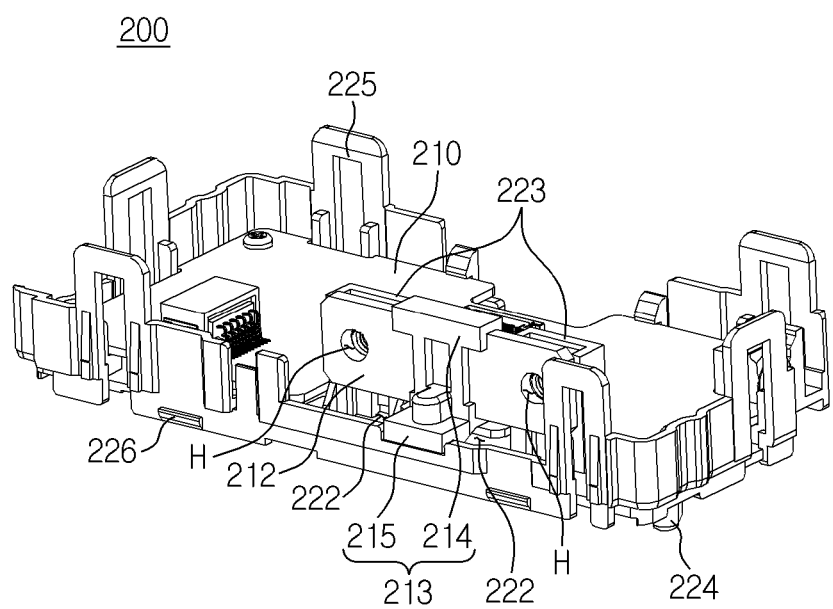
FIG. 7 is a perspective view showing a BMS assembly according to an embodiment of the present disclosure.
Figure 8:
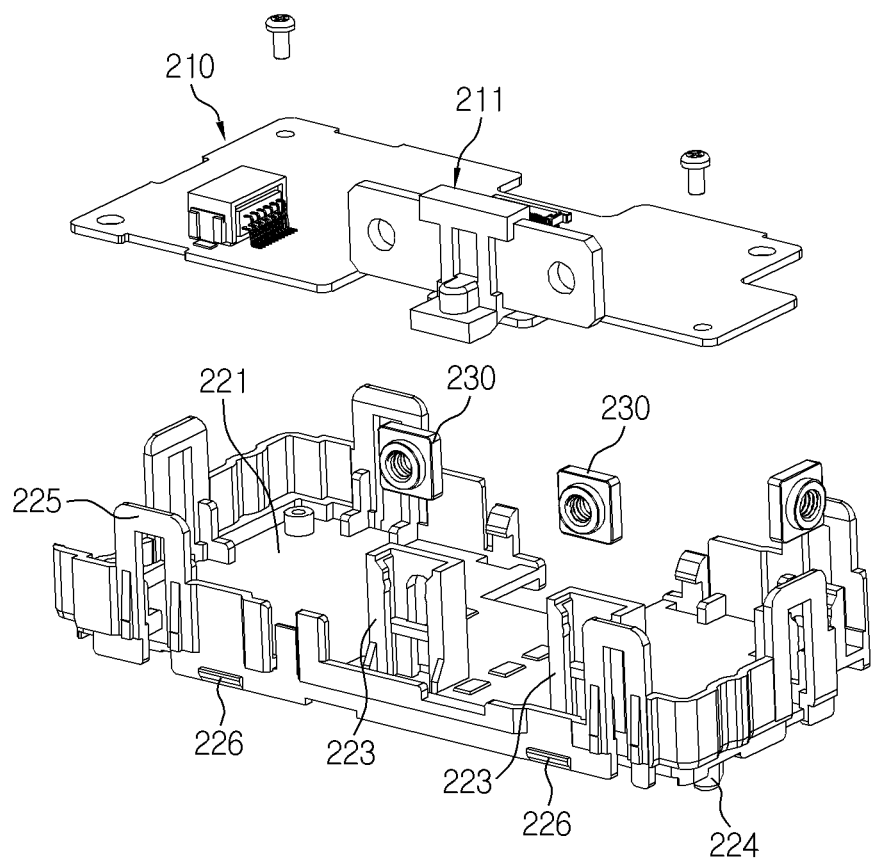
FIG. 8 is an exploded perspective view of FIG. 7.

FIG. 6 is a perspective view showing an assembled state of the BMS assembly and the pack cover of FIG. 4, FIG. 7 is a perspective view showing a BMS assembly according to an embodiment of the present disclosure, and FIG. 8 is an exploded perspective view of FIG. 7.

Referring to FIGS. 6 and 7, the BMS assembly 200 and the pack cover 300 may also be coupled in a snap-fitting manner to facilitate assembly and disassembly.

The BMS assembly 200 includes a BMS circuit board 210 and a BMS housing 220 for supporting the BMS circuit board 210. In addition, the pack cover 300 includes positive and negative electrode terminals 310 and 320 and second positive and negative electrode bus bars 330a and 330b electrically connected to the positive and negative electrode terminals 310 and 320 and may be provided to cover an upper portion of the BMS housing 220 in a state where various electric components such as the BMS circuit board 210 and the current breaking unit 340 are interposed therebetween.

First, the BMS circuit board 210 of the BMS assembly 200 may include various connectors and printed circuit patterns such as a central processing unit (CPU), and the current sensor unit 211.

Referring to FIGS. 7 and 8 along with FIGS. 3 and 4, the current sensor unit 211 is provided to be vertically fixed to the edge of the BMS circuit board 210 to allow the first negative electrode bus bar 120b and the second negative electrode bus bar 330b to be vertically connected thereto. The current sensor unit 211 includes a shunt 212 and a shunt support member 213.

In particular, the shunt 212 is used for measuring a voltage and converting the voltage into a current when it is difficult to directly measure a large current. The shunt 212 refers to a plate-shaped metal resistive body that includes a resistor with a predetermined resistance provided at the center and conductive metal at both sides of the resistor. Lead pins 218 are soldered to both ends of the resistor and to the BMS circuit board 210 so that the magnitude of the current may be measured when a current to be measured is applied to the resistor.

In this embodiment, the shunt 212 is vertically disposed on the BMS circuit board 210 by the shunt support member 213, and in this state, the first negative electrode bus bar 120b is connected to one end of the shunt 212 with respect to the resistor, and the second negative electrode bus bar 330b is connected to the other end of the shunt 212. Further, bolt apertures H of the same diameter are provided at both ends of the shunt 212, one end of the first negative electrode bus bar 120b, and one end of the second negative electrode bus bar 330b, and bolts are inserted into the bolt apertures H to integrally fix and couple the shunt 212 to the first negative electrode bus bar 120b and the second negative electrode bus bar 330b.

Figure 9:
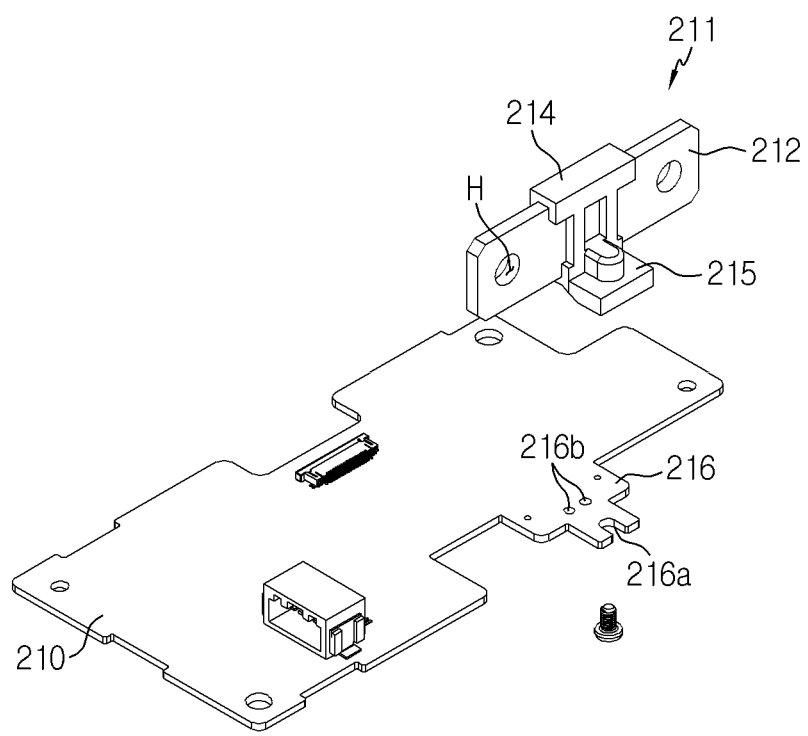
FIGS. 9 and 10 are an exploded perspective view and an assembled perspective view showing the BMS circuit board and the current sensor unit of FIG. 7, respectively.

The shunt support member 213 is fixedly coupled to the shunt installation portion 216 on the BMS circuit board 210 while clamping the shunt 212 to be vertically disposed. In particular, as shown in FIG. 9, the shunt installation portion 216 is a partial edge portion of the BMS circuit board 210, and both side portions of the BMS circuit board 210 based on the shunt installation portion 216 are cut out at least by a length of the shunt 212. Since the BMS circuit board 210 is cut out as above, the first negative electrode bus bar 120b may be vertically connected directly to one end of the shunt 212 at a location directly below a bus bar access portion 222 of the BMS housing 220, which will be explained later. In addition, since the shunt installation portion 216 is protruded farther on the BMS circuit board 210 than other portions, the shunt installation portion 216 may be installed by covering the shunt installation member 213, which will be explained later, thereon.

Figure 10:
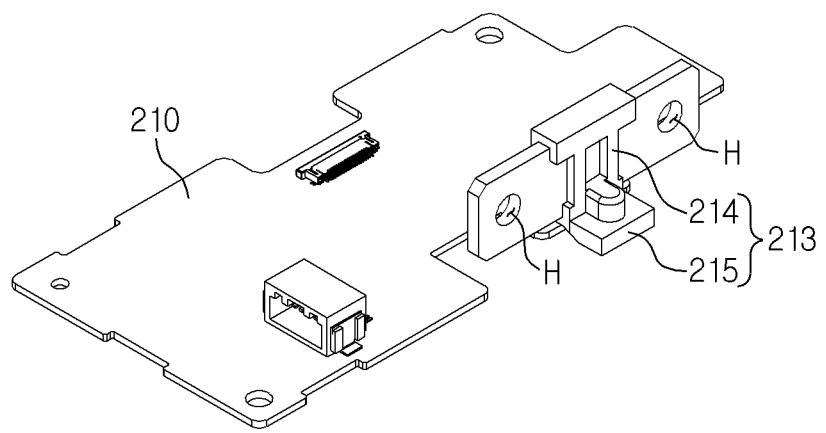
Figure 11:
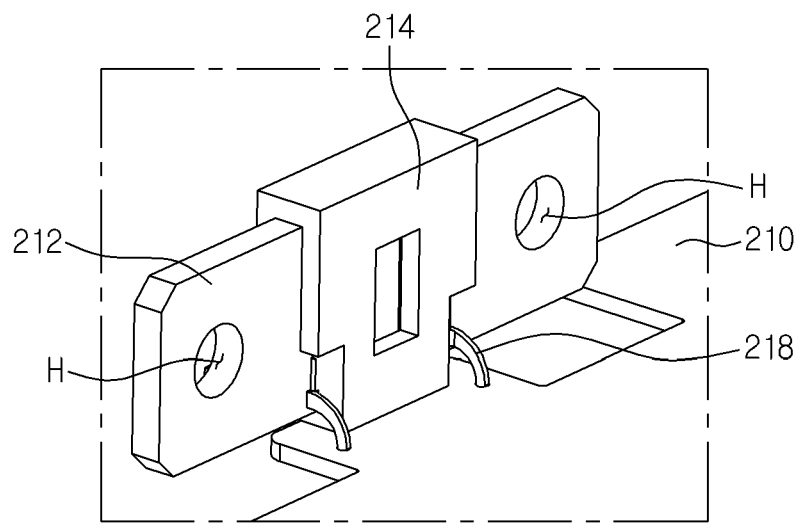
FIG. 11 is a perspective view showing the shunt installation portion of the BMS circuit board from below.

The shunt support member 213 may include a clamping portion 214 and a mounting portion 215. The clamping portion 214 may be provided in a slot form into which the center portion of the shunt 212 or the resistor may be inserted. As shown in FIGS. 10 and 11, the mounting portion 215 may be provided as a single body with the clamping portion 214 and may be disposed on the shunt installation portion 216 in the form of a cap that surround the end of the shunt installation portion 216. The shunt support member 213 may be attached by screw-fastening the mounting portion 215 to the shunt installation portion 216. For reference, in this embodiment, the shunt installation portion 216 may have a depression 216a with a concave shape to allow a screw to be inserted into an edge of the shunt installation portion 216. The screw may be inserted upward from a lower portion of the depression 216a to be fastened to the mounting portion 215 of the shunt support member 213.

Due to the shunt support member 213 having the mounting portion 215 and the shunt installation portion 216, when assembling the shunt support member 213 and the shunt installation portion 216, the current sensor unit 211 may be easily aligned on the BMS circuit board 210, and the assembled state may become more stable since the current sensor unit 211 is not pushed into the BMS circuit board 210 even by an external impact.

In addition, the mounting portion 215 of the shunt support member 213 may include an assembling guide pin 215a. The assembling guide pins 215a may be provided in a pair to extend downward in a vertical direction from a lower surface of the mounting portion 215 by a predetermined length. The pair of assembling guide pins 215a may be inserted into guide pin apertures 216b formed in the shunt installation portion 216. Due to the assembling guide pin 215a and the guide pin apertures 216b, the assembling position of the current sensor unit 211 with respect to the shunt installation portion 216 may be guided, and the movement of the current sensor unit 211 may be prevented during the screw-fastening process, thereby reducing the assembly tolerance.

Figure 12:
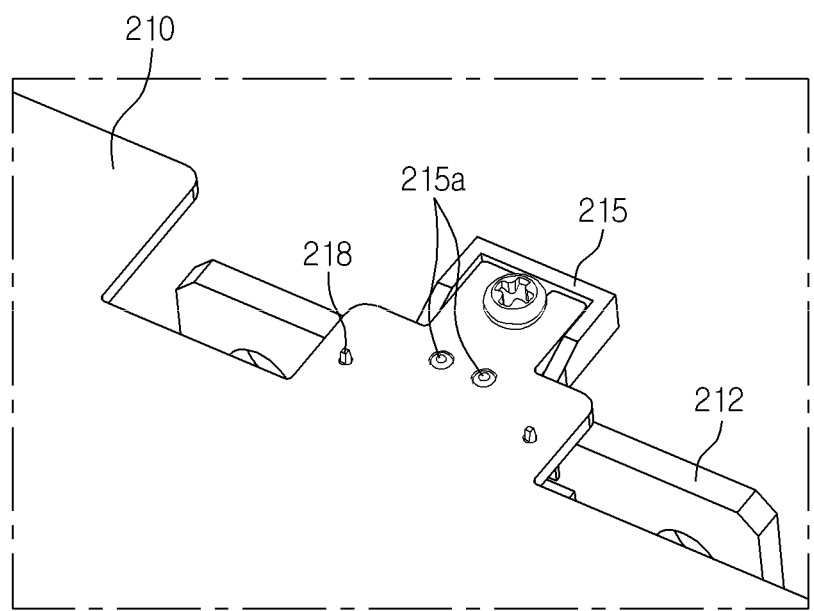
FIG. 12 is a perspective view showing the current sensor unit from the rear.

Referring to FIGS. 11 and 12, the current sensor unit 211 may further include a voltage measuring lead pin 218 that is soldered to the BMS circuit board. The magnitude of the current may be estimated by measuring a voltage drop across both ends of the resistor of the shunt 212 through the voltage measuring lead pin.

The BMS housing will be described with reference to FIGS. 7 and 8 again. The BMS housing 220 may include a horizontal surface 221 on which the BMS circuit board 210 may be disposed, a wall that protrudes along the periphery of the horizontal surface 221, a nut support member 223, at least one leg 224 that protrudes downward from the horizontal surface 221, and a first hooking aperture 225 and a second hooking protrusion 226 formed at the wall.

The horizontal surface 221 has a greater area than the BMS circuit board 210 and is provided to fix the BMS circuit board 210 by screw-fastening. In particular, the horizontal surface 221 may include a bus bar access portion 222 formed by opening its lower portion where the current sensor unit 211 is disposed. In other words, the bus bar access portion 222 is a region where the horizontal surface 221 is opened vertically and forms a path for allowing the first negative electrode bus bar 120b of the cell module assembly 100 to be vertically connected directly to the shunt 212 of the current sensor unit 211.

The nut support member 223 may be a structure on the horizontal surface 221 to support a nut 230 to allow the nut 230 to be disposed at the rear of the bolt aperture H of the shunt 212. The nut support member 223 may be provided to allow the nut 230 to be inserted downward from the top to a height of the bolt aperture H of the shunt 212. For example, an end of the bolt B may be fastened to the nut 230 through the bolt apertures H that are respectively provided at the first negative electrode bus bar 120b and one side of the shunt 212 or at the second negative electrode bus bar 330b and the other side of the shunt 212.

At least one leg 224 is formed in a column shape that extends downward from the lower surface of the BMS housing 220, more particularly, from the lower surface of the horizontal surface 221, in a vertical direction by a predetermined length and is provided to be inserted into the leg insert groove 141 (See FIG. 5) formed in the cell case 140 in one-to-one relationship.

In particular, the at least one leg 224 is provided to limit its insertion depth into the leg insert groove 141, thereby restricting the insertion depth of the BMS housing 220 into the cell case 140 and supporting the BMS housing 220 to be spaced apart from the battery cells 110 or the voltage sensing board 130 by a predetermined interval.

The first hooking aperture 225 and the second hooking protrusion 226 are used for snap-fitting the cell case 140 of the cell module assembly 100 and the pack cover 300, and provided along the periphery of the wall of the BMS housing 220. A first hooking protrusion 350 that corresponds to the first hooking aperture 225 may be provided along the outer periphery of the pack cover 300, and a second hooking aperture 142 that corresponds to the second hooking protrusion 226 may be provided along the outer periphery of the cell case 140. For reference, the locations where the first hooking aperture 225 and the first hooking protrusion 350 as well as the second hooking aperture 142 and the second hooking protrusion 226 are formed may be varied as desired.

Meanwhile, since the BMS housing 220 and the pack cover 300 are coupled using the snap-fitting means as described above, a fastening window 227 may be formed to provide a space where the first negative electrode bus bar 120b and the second negative electrode bus bar 330b may be bolted to both ends of the shunt 212 (See FIG. 6). In other words, the BMS housing 220 and the pack cover 300 may be partially recessed to form the fastening window 227 at the outer peripheries thereof facing each other in a vertical direction.

Figure 13:
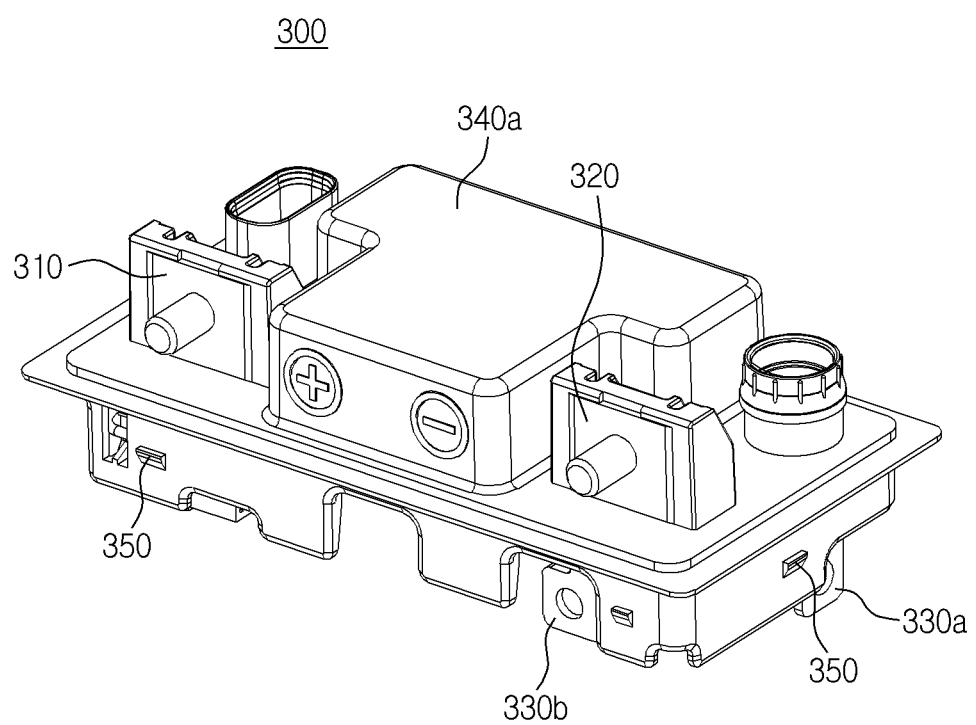
FIG. 13 is a perspective view showing the pack cover according to an embodiment of the present disclosure.
Figure 14:
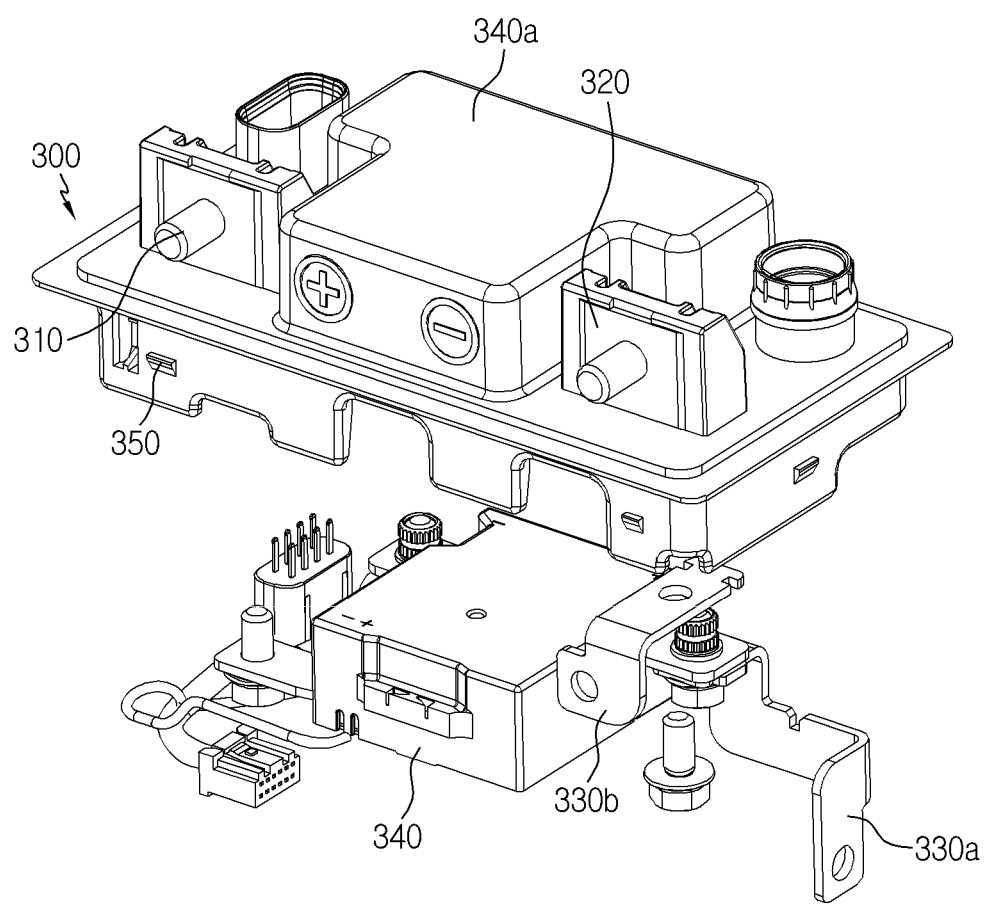
FIG. 14 is an exploded perspective view showing the pack cover of FIG. 13.

In addition, referring to FIGS. 13 and 14, the pack cover 300 may include positive and negative electrode terminals 310 and 320, second positive and negative electrode bus bars 330a and 330b electrically connected to the positive and negative electrode terminals 310 and 320, and a current breaking unit 340.

The positive and negative electrode terminals 310 and 320 are power terminals of the battery pack 10 and may be exposed to the outside of the pack cover 300.

One end of the second positive electrode bus bar 330a and one end of the second negative electrode bus bar 330b may be connected to the positive electrode terminal 310 and the negative electrode terminal 320, respectively, and the other ends thereof may be connected to the first positive electrode bus bar 120a of the cell module assembly 100 and the current sensor unit 211, respectively.

For connection to counterparts, the second positive electrode bus bar 330a and the second negative electrode bus bar 330b are preferably formed to have a shortest distance within a range in which they may avoid obstacles. In this case, the shapes of the second positive electrode bus bar 330a and the second negative electrode bus bar 330b may be bent.

Referring to the second negative electrode bus bar 330b of this embodiment, since one end of the second negative electrode bus bar 330b may be directly coupled to the current sensor unit 211 in a vertical direction, the negative electrode terminal 320 may be directly connected to the current sensor unit 211 merely with a single bending shape, compared to the conventional art (see FIG. 1). For reference, when the position of the negative electrode terminal 320 is directly above the current sensor unit 211, unlike this embodiment, the second negative electrode bus bar 330b may be directly connected to the current sensor unit 211 without bending. Meanwhile, similar to the second negative electrode bus bar 330b, the first negative electrode bus bar 120b may also be directly connected to the current sensor unit 211 in a vertically extended form at the cell module assembly 100. Compared to the conventional art, it may be easily understood that the shape of the first negative electrode bus bar 120b is simplified and minimized.

The current breaking unit 340 is a component that serves as a switch to obstruct a high-voltage current as necessary. The current breaking unit 340 may include electrical components such as relays. The current breaking unit 340 may be electrically connected between the positive electrode terminal 310 and the second positive electrode bus bar 330a and fixedly mounted in the inner space of the pack cover 300.

For example, the pack cover 300 of this embodiment has a ridge portion 340a which is convex toward the outer direction and has an internal space with a shape that corresponds to a shape of the current breaking unit 340, to allow the current breaking unit 340 to be mounted to the ridge portion 340a. Thus, even when the pack cover 300 is coupled to the upper portion of the BMS assembly 200, the current breaking unit 340 and the BMS circuit board 210 or other components may be arranged efficiently and integratedly within the space between the BMS assembly 200 and the pack cover 300.

According to the present disclosure as described above, the electrical connection configuration in the battery pack may be simplified and minimized. In addition, since the current sensor unit 211 having a relatively large volume is vertically installed on the BMS circuit board 210, the space utilization of the BMS circuit board 210 may be improved, and the BMS circuit board may be insulated more easily. In addition, since the main components of the battery pack 10 are modularized to be easily fastened together, the productivity may be improved, and product maintenance may be performed more easily than in the conventional art.

Meanwhile, the battery pack 10 according to the present disclosure may be applied to a vehicle such as an electric vehicle and a hybrid electric vehicle. Accordingly, the vehicle according to the present disclosure may include the battery pack 10 of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, when the terms indicating up, down, left, right, front, and rear directions are used in the specification, it is obvious to those skilled in the art that these merely represent relative directions for convenience of explanation and may vary based on a location of an observer or an object to be observed.

What is claimed is:
1. A battery pack, comprising:
    a cell module assembly that includes:
        battery cells arranged to be stacked;
        a cell case accommodating the battery cells; and
        a first positive electrode bus bar and a first negative electrode bus bar that are electrically connected to the battery cells, wherein an end of the first positive electrode bus bar and an end of the first negative electrode bus bar extend in a longitudinal direction to a location outside of the cell case;
    a battery management system (BMS) assembly that includes:
        a BMS circuit board;
        a current sensor unit disposed at an edge of the BMS circuit board, the current sensor unit having a planar surface in the longitudinal direction; and
        a BMS housing that supports the BMS circuit board, wherein a lower portion of the BMS housing is coupled to the cell case; and a pack cover that includes:
- a positive electrode terminal and a negative electrode terminal; and
- a second positive electrode bus bar and a second negative electrode bus bar that are electrically connected to the positive electrode terminal and the negative electrode terminal, respectively, wherein the second negative electrode bus bar is connected to the current sensor unit, wherein the pack cover is configured to cover an upper portion of the BMS housing, wherein when the cell module assembly is moved in the longitudinal direction relative to the BMS assembly, the end of the first negative electrode bus bar is arranged to directly engage the current sensor unit.

2. The battery pack according to claim 1, wherein the current sensor unit includes:
- a shunt formed as a plate-shaped metal resistor connected to the first negative electrode bus bar and the second negative electrode bus bar and having a bolt aperture formed at each end thereof; and
- a shunt support member configured to clamp the shunt, wherein the shunt support member is fixedly coupled onto the BMS circuit board.

3. The battery pack according to claim 2, wherein the BMS circuit board has a shunt installation portion formed at one side of the edge thereof and screw-fastened to the shunt support member, and
wherein both side portions of the BMS circuit board with respect to the shunt installation portion are cut out to form an empty space at least by a length of the shunt.

4. The battery pack according to claim 3, wherein the shunt support member includes:
- a clamping portion formed as a slot into which a center portion of the shunt is inserted; and
- a mounting portion attached to the shunt installation portion to surround an end of the shunt installation portion.

5. The battery pack according to claim 4, wherein the mounting portion has an assembling guide pin that extends at a lower surface thereof, and the shunt installation portion has a guide pin aperture into which the assembling guide pin is inserted.

6. The battery pack according to claim 3, wherein the BMS housing has a horizontal surface on which the BMS circuit board is disposed, and a nut support member is provided at the horizontal surface to support a nut to allow the nut to be disposed at a rear of the bolt aperture of the shunt.

7. The battery pack according to claim 4, wherein a horizontal surface of the BMS housing has a bus bar access portion formed by opening a lower portion thereof below the shunt to allow the first negative electrode bus bar to be directly coupled to the shunt at a location directly below the shunt.

8. The battery pack according to claim 1, wherein the pack cover and the BMS housing have a first hooking aperture and a first hooking protrusion, respectively, provided to be snap-fitted with each other along outer peripheries thereof, and
wherein the BMS housing and the cell case have a second hooking aperture and a second hooking protrusion, respectively, provided to be snap-fitted with each other along outer peripheries thereof.

9. The battery pack according to claim 1, wherein the BMS housing further includes at least one leg formed at a lower surface of the BMS housing to extend downward in the longitudinal direction by a predetermined length, and
wherein the cell case includes a leg insert groove into which the at least one leg is inserted and coupled in one-to-one relationship.

10. The battery pack according to claim 9, wherein an insertion depth of the leg into the leg insert groove is restricted to allow the BMS housing to be supported and spaced apart from the battery cells with a predetermined interval.

11. The battery pack according to claim 2, wherein outer peripheries of the BMS housing and the pack cover that correspond to each other in the longitudinal direction are partially recessed to form a fastening window therebetween when the BMS housing and the pack cover are coupled,
wherein the fastening window provides a space in which the first negative electrode bus bar and the second negative electrode bus bar are bolted to both ends of the shunt.

12. The battery pack according to claim 1, wherein the pack cover has a ridge portion formed to be convex toward an outer direction and includes a space in the ridge portion to allow a current breaking unit configured to obstruct an electric current of the battery cells to be mounted within the ridge portion.

13. A vehicle, comprising the battery pack according to claim 1.

* * * * *